(12) United States Patent
Zhang et al.

(10) Patent No.: US 11,031,465 B2
(45) Date of Patent: Jun. 8, 2021

(54) SEMICONDUCTOR DEVICE INCORPORATING EPITAXIAL LAYER FIELD STOP ZONE

(71) Applicant: Alpha and Omega Semiconductor (Cayman) Ltd., Grand Cayman (KY)

(72) Inventors: Lei Zhang, Portland, OR (US); Karthik Padmanabhan, San Jose, CA (US); Lingpeng Guan, San Jose, CA (US); Jian Wang, Portland, OR (US); Lingbing Chen, Portland, OR (US); Wim Aarts, Portland, OR (US); Hongyong Xue, Portland, OR (US); Wenjun Li, Portland, OR (US); Madhur Bobde, Santa Clara, CA (US)

(73) Assignee: Alpha and Omega Semiconductor (Cayman) Ltd., Grand Cayman (KY)

( * ) Notice: Subject to any disclaimer, the term of this patent is extended or adjusted under 35 U.S.C. 154(b) by 0 days.

(21) Appl. No.: 16/419,277

(22) Filed: May 22, 2019

(65) Prior Publication Data

US 2019/0273131 A1    Sep. 5, 2019

Related U.S. Application Data

(63) Continuation of application No. 15/637,352, filed on Jun. 29, 2017, now abandoned.

(51) Int. Cl.
*H01L 29/06* (2006.01)
*H01L 29/739* (2006.01)
(Continued)

(52) U.S. Cl.
CPC ...... *H01L 29/0638* (2013.01); *H01L 27/0716* (2013.01); *H01L 29/36* (2013.01);
(Continued)

(58) Field of Classification Search
CPC . H01L 29/36; H01L 29/7395; H01L 29/7396; H01L 29/7397; H01L 29/66333; H01L 29/0638; H01L 27/0664
See application file for complete search history.

(56) References Cited

U.S. PATENT DOCUMENTS

| 7,538,412 | B2 | 5/2009 | Schulze et al. |
| 7,910,486 | B2 | 3/2011 | Yilmaz et al. |

(Continued)

OTHER PUBLICATIONS

Matthias et al., "1.7kV High-Power IGBT Fabrication by Bonded-Wafer-Concept", Proceedings of the 27th International Symposium on Power Semiconductor Devices & IC's, May 10-14, 2015, pp. 409-412, Kowloon Shangri-La, Hong Kong.

*Primary Examiner* — Mohammed Shamsuzzaman
*Assistant Examiner* — Aaron J Gray
(74) *Attorney, Agent, or Firm* — Carmen C. Cook

(57) ABSTRACT

A semiconductor device includes a semiconductor body having a base region incorporating a field stop zone where the base region and the field stop zone are both formed using an epitaxial process. Furthermore, the epitaxial layer field stop zone is formed with an enhanced doping profile to realize improved soft-switching performance for the semiconductor device. In some embodiments, the enhanced doping profile formed in the field stop zone includes varying, non-constant doping levels. In some embodiments, the enhanced doping profile includes one of an extended graded doping profile, a multiple stepped flat doping profile, or a multiple spike doping profile. The epitaxial layer field stop zone of the present invention enables complex field stop zone doping profiles to be used to obtain the desired soft-switching characteristics in the semiconductor device.

10 Claims, 9 Drawing Sheets

(51) Int. Cl.
   *H01L 27/07* (2006.01)
   *H01L 29/36* (2006.01)
   *H01L 29/66* (2006.01)
   *H01L 29/861* (2006.01)
   *H01L 27/06* (2006.01)
   *H01L 21/265* (2006.01)
   *H01L 21/266* (2006.01)
   *H01L 21/324* (2006.01)
   *H01L 21/02* (2006.01)
   *H01L 21/304* (2006.01)

(52) U.S. Cl.
   CPC .. *H01L 29/66333* (2013.01); *H01L 29/66348* (2013.01); *H01L 29/7395* (2013.01); *H01L 29/7397* (2013.01); *H01L 29/861* (2013.01); *H01L 21/02236* (2013.01); *H01L 21/266* (2013.01); *H01L 21/26513* (2013.01); *H01L 21/304* (2013.01); *H01L 21/324* (2013.01); *H01L 27/0664* (2013.01)

(56) References Cited

U.S. PATENT DOCUMENTS

| | | |
|---|---|---|
| 8,003,502 B2 | 8/2011 | Mauder et al. |
| 8,084,814 B2 | 12/2011 | Nemoto et al. |
| 8,299,494 B2 | 10/2012 | Yilmaz et al. |
| 8,653,556 B2 | 2/2014 | Niedernostheide et al. |
| 9,129,851 B2 | 9/2015 | Kouno et al. |
| 9,825,023 B2 | 11/2017 | Basler et al. |
| 2012/0267681 A1* | 10/2012 | Nemoto ............. H01L 29/0821 257/139 |
| 2014/0027814 A1 | 1/2014 | Pfirsch |
| 2015/0228723 A1 | 8/2015 | Werber et al. |
| 2015/0236142 A1 | 8/2015 | Laven et al. |
| 2015/0325440 A1 | 11/2015 | Schulze et al. |
| 2016/0093690 A1* | 3/2016 | Falck ................ H01L 29/66136 257/139 |
| 2016/0111415 A1 | 4/2016 | Basler et al. |
| 2016/0197143 A1 | 7/2016 | Naito |
| 2016/0211257 A1 | 7/2016 | Yoshida |
| 2016/0284803 A1 | 9/2016 | Baburske et al. |
| 2016/0322472 A1* | 11/2016 | Schloegl ............ H01L 29/66712 |
| 2017/0271450 A1* | 9/2017 | Takahashi ........... H01L 29/1083 |

* cited by examiner

SEMICONDUCTOR DEVICE INCORPORATING EPITAXIAL LAYER FIELD STOP ZONE

CROSS REFERENCE TO OTHER APPLICATIONS

This application is a continuation of U.S. patent application Ser. No. 15/637,352, entitled SEMICONDUCTOR DEVICE INCORPORATING EPITAXIAL LAYER FIELD STOP ZONE, filed Jun. 29, 2017, which is incorporated herein by reference for all purposes.

BACKGROUND OF THE INVENTION

Semiconductor devices, such as discrete diodes and discrete insulated gate bipolar transistors, are typically formed in a semiconductor body including a lightly doped base region formed on a heavily doped substrate as the backside cathode/collector. The device region, such as the pn junction of the semiconductor device, is formed on the top or front side of the semiconductor body. In order to realize soft switching behavior in these semiconductor devices, especially when the thickness of the base region has to be kept thin, the semiconductor body often incorporates a field stop zone away from the device region and close to the backside substrate. The field stop zone is a region having the same doping type as the base region but with increased doping level as compared to the base region. The field stop zone has the effect of preventing the space charge region of the pn junction from propagating too far into the lightly doped base region. In practice, the field stop zone prevents the space charge region of the pn junction from reaching the backside cathode/collector. In this manner, the base region can be formed using the desired low doping levels and with the desired thickness while achieving soft switching for the semiconductor device thus formed.

Conventional methods for forming the field stop zone typically involve using high energy backside dopant implantation. The wafer is put through the front-side processing to form the device region and then the wafer is subjected to backside grinding to the desired thickness. Then, to form the field stop zone, one or more backside implantation is performed to introduce dopants into an area of the base region that is distant from the device region. For example, conventional methods typically use proton implantation or multiple helium or hydrogen implantations from the wafer backside to form the field stop zone. Then, a thermal anneal is carried out to activate the hydrogen-related donors. FIG. 1 duplicates FIG. 1 of U.S. Pat. No. 7,538,412 and illustrates an IGBT formed including a field stop zone 26 formed by high energy backside implantation. FIG. 2 duplicates FIG. 2a of the U.S. Pat. No. 7,538,412 and illustrates an example doping profile of the field stop region as a result of the multiple backside implantations.

The conventional methods for forming the field stop zone in a semiconductor body have many shortcomings. First, when high energy backside implantation is used, it is difficult to form deeply extending field stop zone, which requires extremely high implantation energy which is either not feasible, limited by implant equipment, or not manufacturable or associated with unaffordable cost.

Second, when high energy backside implantation is used, the ability to form the desired field stop zone doping profile becomes limited. In some cases, a large number of implantations is needed to form the desired doping profile. Large number of implantations is not desirable and can be costly.

Lastly, since the backside implantation and anneal are carried out after wafer front-side processing is done, the anneal temperature for the backside implant cannot be too high. For example, the anneal temperature for the backside implant cannot exceed 500° C. or 550° C. because of the metallization layer formed on the front side. The available anneal temperature range limits the implantation dose and energy that can be used for the backside implant because higher implant dose or higher implant energy requires longer thermal process to anneal the implant damage or defects.

BRIEF DESCRIPTION OF THE DRAWINGS

Various embodiments of the invention are disclosed in the following detailed description and the accompanying drawings.

FIGS. 3(a) to 3(c), are cross-sectional views of semiconductor devices that can be constructed using the epitaxial layer field stop zone in embodiments of the present invention.

FIGS. 4(a) to 4(b), are cross-sectional views of examples of semiconductor body incorporating an epitaxial layer field stop zone which can be used to form semiconductor devices in embodiments of the present invention.

FIGS. 5(a) and 5(b), illustrates a semiconductor body incorporating an epitaxial layer field stop zone and a graded doping profile which can be formed in the field stop zone in embodiments of the present invention.

FIGS. 6(a)-6(c), illustrates a semiconductor body incorporating an epitaxial layer field stop zone and a stepped doping profile which can be formed in the field stop zone in embodiments of the present invention.

FIGS. 7(a)-7(c), illustrates a semiconductor body incorporating an epitaxial layer field stop zone and a spike doping profile which can be formed in the field stop zone in embodiments of the present invention.

FIGS. 8(a) and 8(b), are cross-sectional views of RC-IGBT semiconductor devices that can be constructed using the epitaxial layer field stop zone in embodiments of the present invention.

FIGS. 9(a) to 9(h), illustrates the semiconductor device fabrication method for forming an RC-IGBT in embodiments of the present invention.

DETAILED DESCRIPTION

Figure 1:
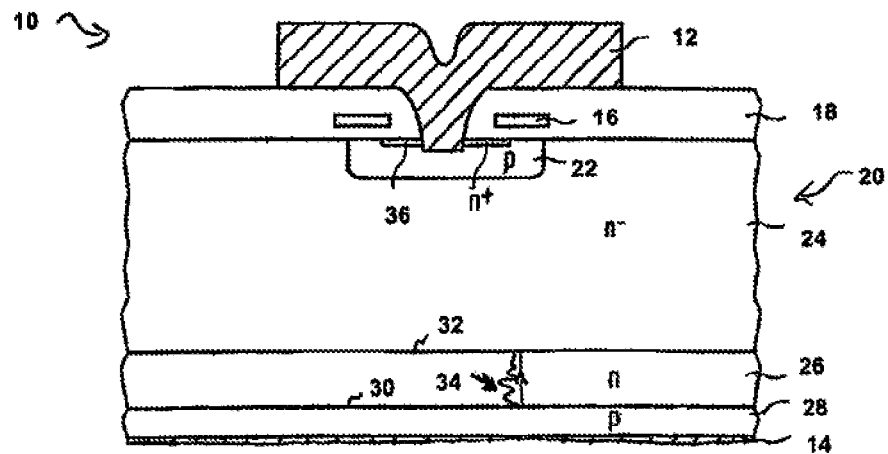
FIG. 1 duplicates FIG. 1 of U.S. Pat. No. 7,538,412 and illustrates an IGBT formed including a field stop zone 26 formed by high energy backside implantation.
Figure 2:
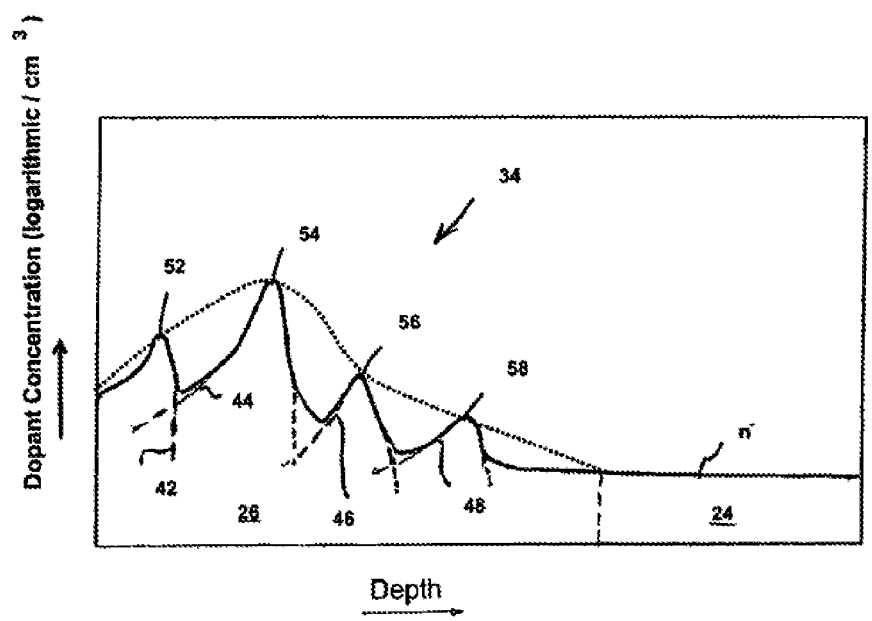
FIG. 2 duplicates FIG. 2a of the U.S. Pat. No. 7,538,412 and illustrates an example doping profile of the field stop region as a result of the multiple backside implantations.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment.

The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a semiconductor device includes a semiconductor body having a base region incorporating a field stop zone where the base region and the field stop zone are both formed using an epitaxial process. Furthermore, the epitaxial layer field stop zone is formed with an enhanced doping profile to realize improved soft-switching performance for the semiconductor device. In some embodiments, the enhanced doping profile formed in the field stop zone includes varying, non-constant doping levels. In some embodiments, the enhanced doping profile includes one of an extended graded doping profile, a multiple stepped flat doping profile, or a multiple spike doping profile. The epitaxial layer field stop zone of the present invention enables complex field stop zone doping profiles to be used to obtain the desired soft-switching characteristics in the semiconductor device.

In embodiments of the present invention, the semiconductor device that can be formed using the epitaxial layer field stop zone includes discrete PN junction diodes and insulated gate bipolar transistor (IGBT) devices. Furthermore, in some embodiments, the semiconductor device is a reverse conducting IGBT (RC-IGBT) device where the field stop zone with enhanced doping profile is incorporated to improve the soft-switching characteristics of the RC-IGBT.

The epitaxial layer field stop zone with enhanced doping profile formed in a semiconductor device realizes many advantages over conventional field stop zone formed using backside ion implantations. In particular, the epitaxial process makes it possible to form the field stop zone with sophisticated doping profiles which are not possible or very difficult to form using backside implantation method. In this manner, the doping profile of the field stop zone can be tailored to meet specific requirements of the semiconductor device and to realize specific electrical characteristics for the semiconductor device. The epitaxial layer field stop zone with the enhanced doping profile improves the soft switch performance of IGBT and diode devices, reducing current ringing and reverse voltage spiking. The epitaxial layer field stop zone with the enhanced doping profile is also beneficial to achieve balance between improved short-circuit ruggedness and desired leakage current characteristics on IGBT devices. The overall electrical characteristics for the semiconductor device can be greatly improved.

Second, by using the epitaxial layer field stop zone in accordance with embodiments of the present invention, the semiconductor device can be formed without using backside processing on thin wafer and the field stop zone process is compatible with existing front-side processing. Forming the field stop zone using the epitaxial process is thus more cost effective and process friendly as compared to the conventional method of backside ion implantation.

Third, by using the epitaxial process to form the field stop zone and the base region, the thickness of the base region, which is the depth of the field stop zone, can be well controlled to obtain the desired depth for the field stop zone. Control of the depth of the field stop zone is not easily achieved using the conventional backside implantation method.

Epitaxial Field Stop Zone

Figure 3:
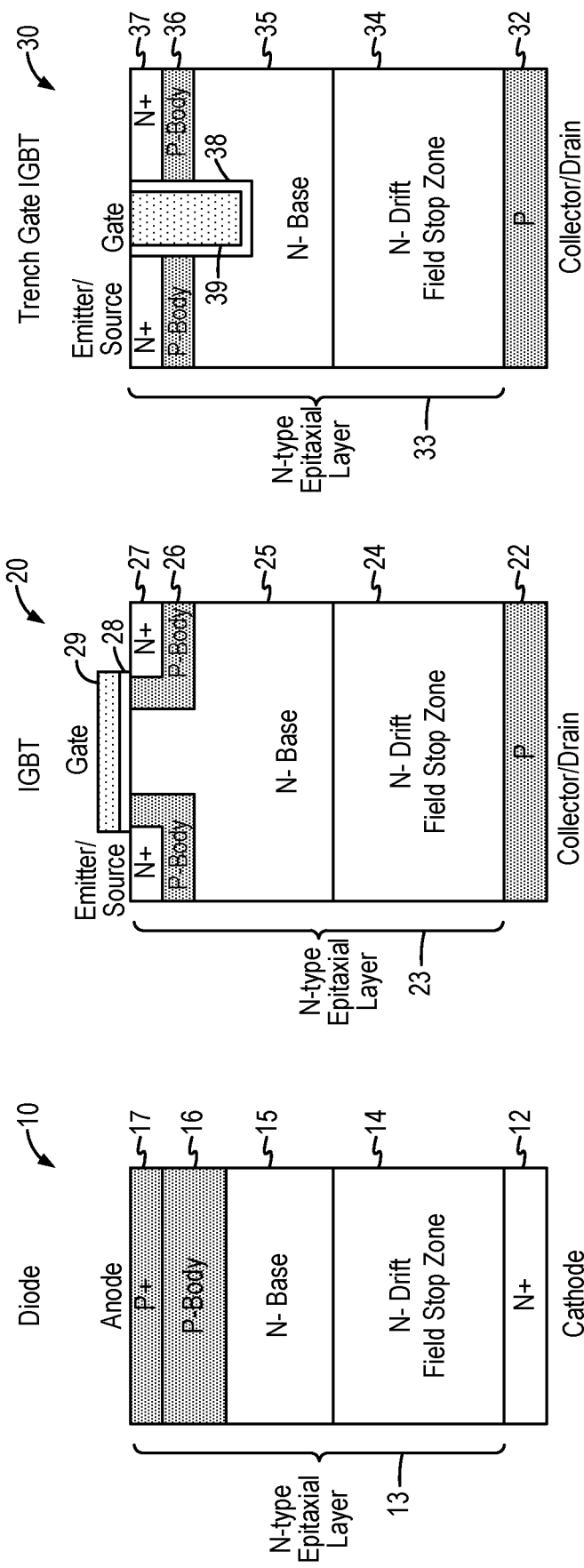
FIG. 3, which includes

FIG. 3, which includes FIGS. 3(a) to 3(c), are cross-sectional views of semiconductor devices that can be constructed using the epitaxial layer field stop zone in embodiments of the present invention. Referring to FIG. 3(a), a discrete PN junction diode 10 is formed in a semiconductor body including a heavily doped N+ substrate 12 and an N-type epitaxial layer 13 formed thereon. The N+ substrate 12 forms the backside cathode of the diode 10. An N-type base region (N-Base) 15 and a field stop zone 14 are formed in the N-type epitaxial layer 13 where the field stop zone 14 is formed using an enhanced doping profile, such as extended graded doping profile or multiple stepped flat doping profile or others. The field stop zone 14 is formed in a lower portion of the epitaxial layer 13, adjacent to the substrate 12, and the N-base 15 is formed on the field stop zone 14. A P-body region 16 is formed in the top or front side of the N-Base 15, away from the field stop zone 14. A heavily doped P-type (P+) region 17 is formed in the P-body region 16 as the anode of the diode 10. As thus configured, a PN junction is formed between the P-body 16 and N-Base 15. The field stop zone 14 functions as the drift region of the diode 10 and prevents the space charge region formed at the P-body and N-Base junction from extending to the N+ substrate 12. Specific field stop zone doping profiles can be selected for the field stop zone 14 to achieve the desired soft switching characteristics. In embodiments of the present invention, the field stop zone has a doping profile having doping levels that vary within the field stop zone. That is, the doping levels in the field stop zone are not constant throughout the field stop zone.

Referring to FIG. 3(b), a discrete IGBT 20 is formed in a semiconductor body including a P-type substrate 22 and an N-type epitaxial layer 23 formed thereon. The P-type substrate 22 forms the backside collector/drain of the IGBT 20. An N-type base region (N-Base) 25 and a field stop zone 24 are formed in the N-type epitaxial layer 23 where the field stop zone 24 is formed using an enhanced doping profile, such as extended graded doping profile or multiple stepped flat doping profile or others. The field stop zone 24 is formed in a lower portion of the epitaxial layer 23, adjacent to the substrate 22, and the N-base 25 is formed on the field stop zone 24. A P-body region 26 is formed in the top or front side of the N-Base 25, away from the field stop zone 24. The P-body region 26 houses a heavily doped N+ emitter/source region 27. A conductive gate 29 of the IGBT is formed on and insulated from the top or front side of the epitaxial layer 23 by a gate dielectric layer 28. The conductive gate 29 is typically a polysilicon layer and the gate dielectric layer 28 is typically a thin gate oxide layer. In the present example, the conductive gate 29 is positioned in the center of the front side of the semiconductor body and the N+ source region 27 and the P-body region 26 are formed on the sides of the gate 29 or surround the gate 29. As thus configured, the IGBT 20 is formed with a PN junction between the P-body 26 and N-Base 25. The field stop zone 24 functions as the drift region of the IGBT 20 and prevents the space charge region formed at the P-body and N-Base junction from extending to the P-type substrate 22. Specific field stop zone doping profiles can be selected for the field stop zone 24 to achieve the desired soft switching characteristics. In embodiments of the present invention, the field stop zone has a doping profile having doping levels that vary within the field stop zone.

That is, the doping levels in the field stop zone are not constant throughout the field stop zone.

Referring to FIG. 3(c), a discrete trench IGBT 30 is formed in a semiconductor body including a P-type substrate 32 and an N-type epitaxial layer 33 formed thereon. The P-type substrate 32 forms the backside collector/drain of the trench gate IGBT 30. An N-type base region (N-Base) 35 and a field stop zone 34 are formed in the N-type epitaxial layer 33 where the field stop zone 34 is formed using an enhanced doping profile, such as extended graded doping profile or multiple stepped flat doping profile or others. The field stop zone 34 is formed in a lower portion of the epitaxial layer 33, adjacent to the substrate 32, and the N-base 35 is formed on the field stop zone 34. A P-body region 36 is formed in the top or front side of the N-Base 35, away from the field stop zone 34. The P-body region 36 houses a heavily doped N+ emitter/source region 37. A trench gate 39 of the IGBT 30 is formed in a trench formed in the front side of the epitaxial layer 33. The trench gate 39 is insulated from the sidewall of the trench by a gate dielectric layer 38. The trench gate 39 is typically a polysilicon layer and the gate dielectric layer 38 is typically a thin gate oxide layer. In the present example, the trench gate 39 is positioned in the center of the front side of the semiconductor body and the N+ source region 37 and the P-body region 36 are formed on the sides of the trench gate 39 or surround the trench gate 39. As thus configured, the trench gate IGBT 30 is formed with a PN junction between the P-body 36 and N-Base 35. The field stop zone 34 functions as the drift region of the trench IGBT 30 and prevents the space charge region formed at the P-body and N-Base junction from extending to the P-type substrate 32. Specific field stop zone doping profiles can be selected for the field stop zone 34 to achieve the desired soft switching characteristics. In embodiments of the present invention, the field stop zone has a doping profile having doping levels that vary within the field stop zone. That is, the doping levels in the field stop zone are not constant throughout the field stop zone.

Figure 4:
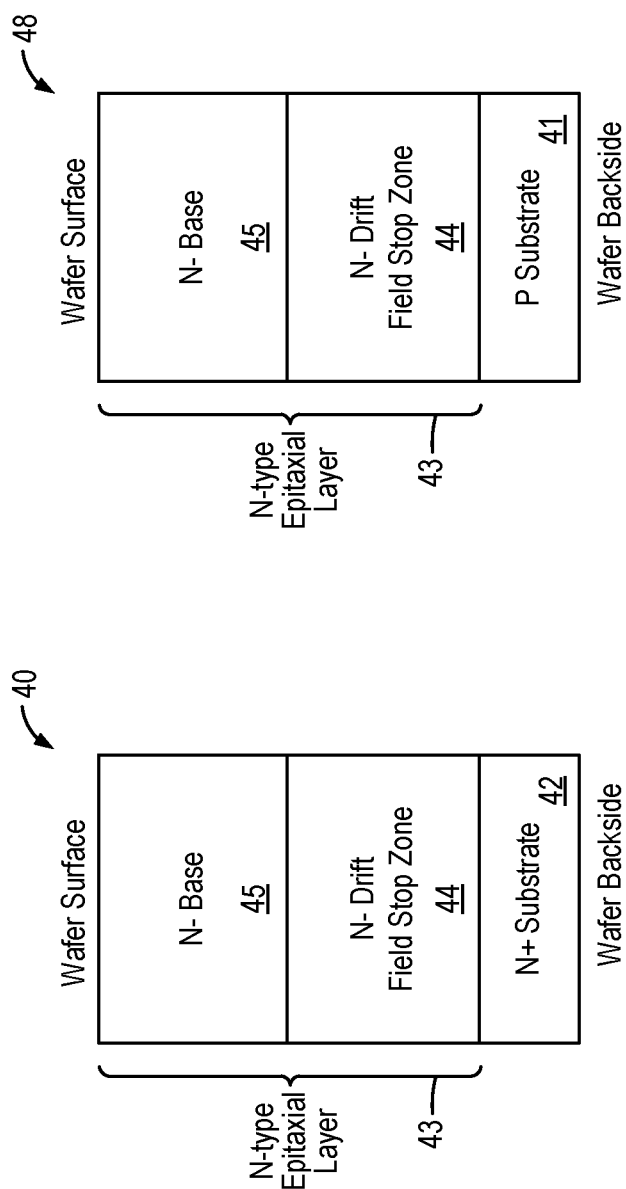
FIG. 4, which includes

FIG. 4, which includes FIGS. 4(a) to 4(b), are cross-sectional views of examples of semiconductor body incorporating an epitaxial layer field stop zone which can be used to form semiconductor devices in embodiments of the present invention. Referring to FIG. 4(a), a semiconductor body 40 has an N+ substrate 42 and an N-type epitaxial layer 43 formed thereon by an epitaxial process. The epitaxial layer 43 is formed to include a field stop zone epitaxial layer 44 formed on the N+ substrate 42 and an N-type base region (N-Base) 45 formed on the field stop zone epitaxial layer 44. More specifically, the epitaxial process grows the N-type epitaxial layer 43 onto the N+ substrate 42. The epitaxial process is carried out by adjusting the N-type doping concentration to form the desired doping profile for the field stop zone 44 and then to form the constant doping level for the N-Base 45.

More specifically, during the first portion of the epitaxial process, the N-type doping concentration being used is adjusted or varied to form the epitaxial layer for the field stop zone 44 having the desired doping profile. The doping level is not constant throughout the field stop zone 44 but instead a varying doping level is used to create a doping profile that is useful in supporting robust soft switching characteristics in the semiconductor device to be formed. Then, when the field stop zone epitaxial layer 44 is completed, the epitaxial process continues with a constant N-type doping level to form the base region epitaxial layer 45. In some embodiments, the base region epitaxial layer 45 is lightly doped and the doping level for the N-base region 45 establishes the minimum doping level of the field stop zone. The field stop zone 44 includes regions having higher doping levels than the N-base region with specific doping profile being selected to achieve the desired soft switching behavior for the semiconductor device to be formed. Furthermore, the doping levels within the field stop zone 44 are not constant but vary within the field stop zone to achieve the desired soft switching characteristics.

In the embodiment shown in FIG. 4(a), the semiconductor body 40 includes an N+ substrate 42 which is useful for forming a PN junction diode device. In other embodiments, the epitaxial layer field stop zone can be applied in a semiconductor body including other types of substrate, such as N-type or P-type substrate, and heavily doped or lightly doped substrate of either dopant polarity. The use of a specific substrate in the present description is illustrative only and is not intended to be limiting. For example, FIG. 4(b) illustrates a semiconductor body 48 including a P-type substrate 41. The N-type epitaxial layer 43 is formed on the P-type substrate 41 in the same manner as described above with reference to FIG. 4(a) to form the field stop zone epitaxial layer 44 and the N-Base epitaxial layer 45. The semiconductor body 48 is useful for forming an IGBT device, including a trench gate IGBT device.

As thus formed, the semiconductor body 40 or 41 can then be used to form the desired semiconductor device by applying front side processing to the wafer surface of the N-base 45. No backside processing is required for the semiconductor device as the field stop zone is already formed. In embodiments of the present invention, the epitaxial layer field stop zone is formed with enhance doping profile to achieve the desired soft switching behavior in the semiconductor device to be formed. The below description provides examples of doping profiles which can be formed in the field stop zone. The doping profile examples below are illustrative only and are not intended to be limiting. One of ordinary skilled in the art would appreciate that different doping profiles can be achieved for the field stop zone by adjusting the N-type doping concentration during the epitaxial process.

(1) Extended Graded Doping Field Stop Zone

Figure 5:
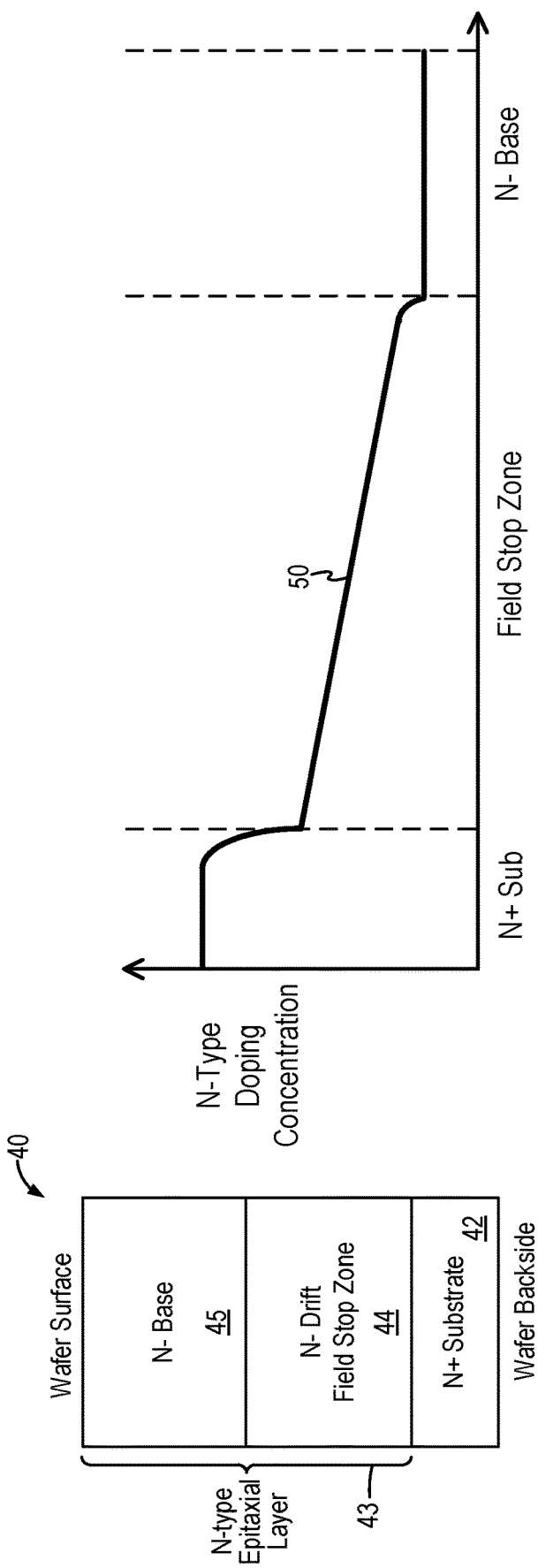
FIG. 5, which includes

FIG. 5, which includes FIGS. 5(a) and 5(b), illustrates a semiconductor body incorporating an epitaxial layer field stop zone and a graded doping profile which can be formed in the field stop zone in embodiments of the present invention. FIG. 5(a) duplicates FIG. 4(a) and illustrates the semiconductor body 40 including the N+ substrate 42 and an N-type epitaxial layer 43 formed thereon. FIG. 5(b) illustrates an extended graded doping profile 50 which can be formed in the epitaxial layer field stop zone in the present example. The doping profile shown in FIG. 5(b) illustrates the N-type doping concentration from the N+ substrate 42 to the N-base 45 from left to right.

In the present example, the substrate 42 is a heavily doped N-type substrate and thus the substrate 42 has a high N-type doping concentration. The epitaxial process grows the epitaxial layer 43 on the substrate 42. The field stop zone has an extended graded doping profile 50. That is, the field stop zone has a starting doping level, lower than the doping level of the N+ substrate and the doping level of the field stop zone decreases linearly to an ending doping level. The N-Base region 45 is then formed with the epitaxial layer having a constant doping level. The N-Base region 45 is typically lightly doped and thus the N-Base region 45 has a low N-type doping level. The ending doping level of the field stop zone 44 can be the same as or higher than the doping level of the N-Base region 45.

In embodiments of the present invention, the graded doping profile of the field stop zone can be tuned to obtain the desired layer thickness and doping level for the field stop zone. Furthermore, the layer thickness of the N-base region 45 can be tuned to obtain the desired depth of the field stop zone from the wafer surface. Accordingly, by using the epitaxial process, a field stop zone with a deeply extended graded doping profile can be formed at a desired depth from the wafer surface. The thickness and doping level of the field stop zone 44 define the depletion layer depth and determines the working voltage of the semiconductor device to be formed. By incorporating the field stop zone with the graded doping profile, large operating voltage changes will not result in dramatic changes in the depletion layer depth. In this manner, voltage spiking and current ringing are reduced and the semiconductor device to be formed has improved soft switching behavior.

In one embodiment, the epitaxial process for forming the epitaxial layer 43 uses two N-type doping concentration set points during the epitaxy growth process to form the field stop zone. The epitaxial process begins the epitaxy growth at the field stop zone starting doping concentration. The epitaxy growth rate is fixed while the doping gas flow is reduced gradually so that when the desired thickness for the field stop zone is reached, the epitaxial process is at the field stop zone ending doping concentration. Accordingly, the rate of doping gas flow reduction is a function of the desired graded doping and the thickness of the field stop zone. After the field stop zone is formed, the epitaxial process continues at a constant N-type doping concentration set point to form the base region epitaxial layer. The constant N-type doping concentration set point for the base region can be the same as or less than the field stop zone ending doping concentration.

(2) Multiple Stepped Flat Doping Field Stop Zone

Figure 6:
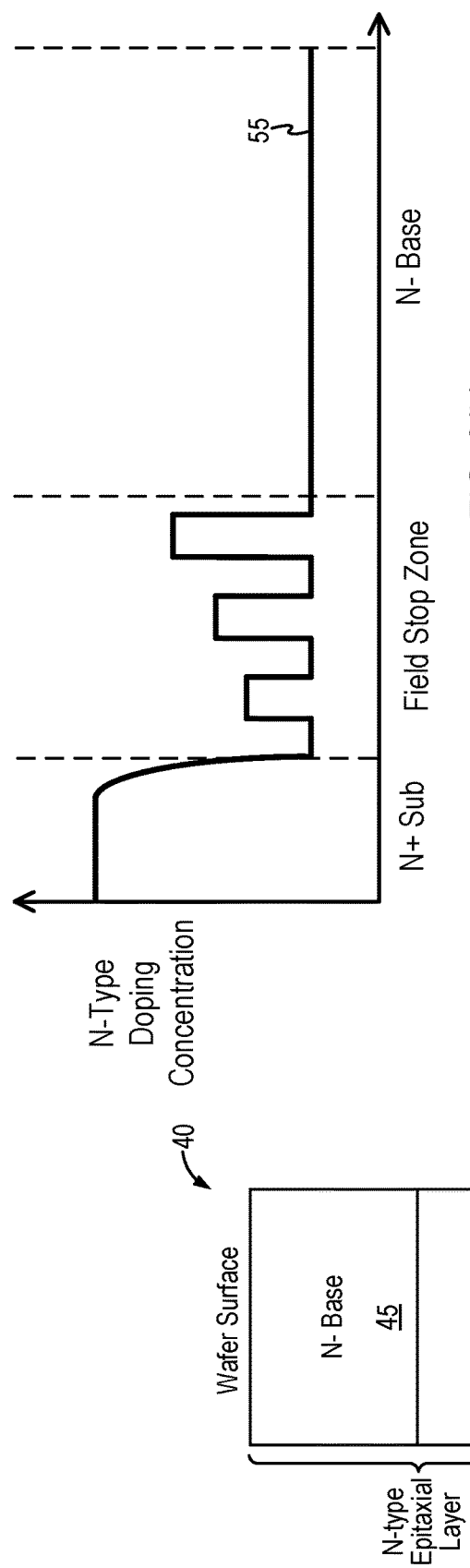
FIG. 6, which includes
Figure 6:
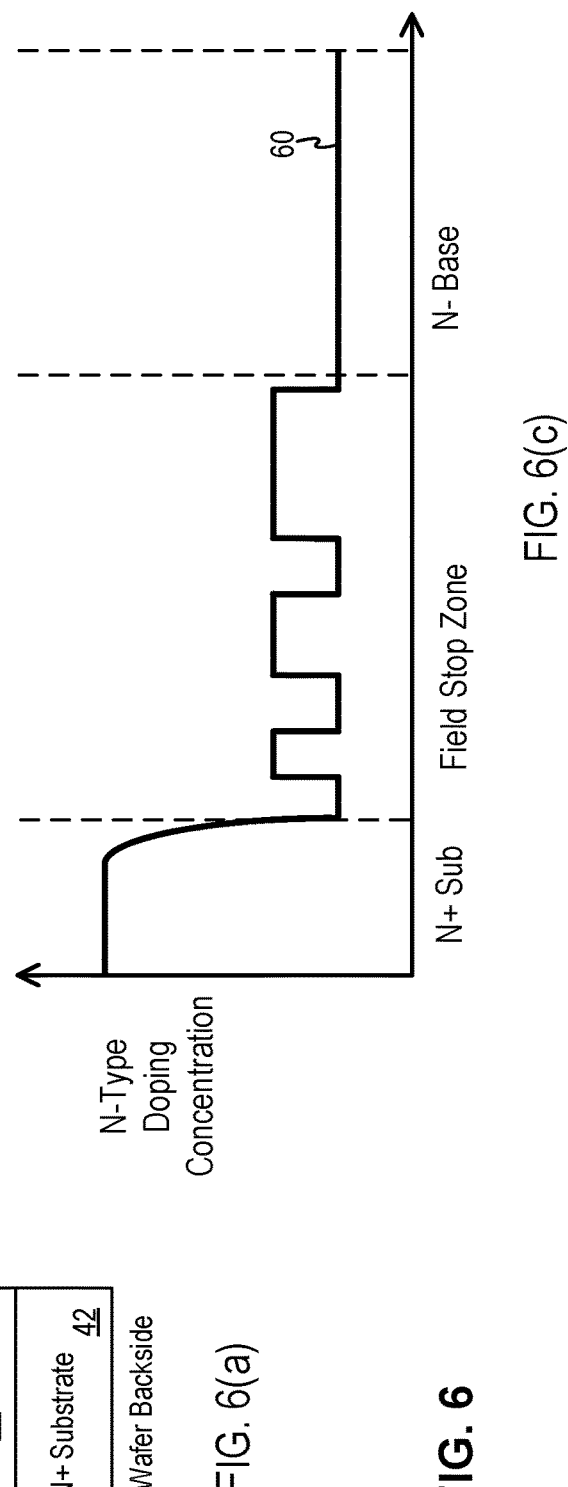

FIG. 6, which includes FIGS. 6(a)-6(c), illustrates a semiconductor body incorporating an epitaxial layer field stop zone and a stepped doping profile which can be formed in the field stop zone in embodiments of the present invention. FIG. 6(a) duplicates FIG. 4(a) and illustrates the semiconductor body 40 including the N+ substrate 42 and an N-type epitaxial layer 43 formed thereon. FIGS. 6(b) and 6(c) illustrate examples of the stepped doping profiles 55, 60 which can be formed in the epitaxial layer field stop zone in the present embodiment. The doping profiles shown in FIGS. 6(b) and 6(c) illustrate the N-type doping concentration from the N+ substrate 42 to the N-base 45 from left to right.

In the embodiment shown in FIG. 6(b), the substrate 42 is a heavily doped N-type substrate and thus the substrate 42 has a high N-type doping concentration. The epitaxial process grows the epitaxial layer 43 on the substrate 42. The field stop zone 43 has a multiple stepped flat doping profile 55. That is, the field stop zone has a background doping level and multiple flat top regions with step increase in doping levels. The flat top regions are spaced apart in the field stop zone. The N-Base region 45 is then formed with the epitaxial layer having a constant doping level. The N-Base region 45 is typically lightly doped and thus the N-Base region 45 has a low N-type doping level. The background doping level of the field stop zone 44 can be the same as or higher than the doping level of the N-Base region 45.

In the example shown in FIG. 6(b), the field stop zone includes three flat top regions having substantially the same width or same epitaxial layer thickness and with increasing doping levels. That is, the flat top region closer to the substrate has lower doping level than the flat top region farthest from the substrate and the doping level increases gradually from the first flat top region near the substrate to the last flat top region near the N-base region.

In other embodiments, the width or thickness of the flat top regions, the spacing of the flat top regions and the doping level of the flat top regions can be tuned to obtain the desired doping profile for the field stop zone. In particular, the doping levels or the thickness of the flat top region can be selected based on the application voltage of the semiconductor device to be formed. For example, in other embodiments, the flat top regions can all have the same doping levels. In another example, the flat top regions can have different width or epitaxial layer thicknesses while having the same or different doping levels. The doping levels can increase towards the N-base region or decrease towards the N-base region. In one example, the flat top region closes to the N-base region can have a higher doping level or an increased thickness as compared to the flat top regions closer to the substrate to stop the spread of the depletion layer under certain application voltage levels so as to reduce current ringing.

FIG. 6(c) illustrates an alternate embodiment of the stepped flat doping profile 60 where the field stop zone includes multiple stepped flat top regions having the same doping level but with different epitaxial layer thickness. In the example shown in FIG. 6(c), the flat top regions increase in layer thickness, illustrated as increasing width in the doping profile in FIG. 6(c), from the first flat top region near the substrate to the last flat top region near the N-base region.

The multiple stepped flat doping profiles described herein can be applied in a field stop zone to improve the soft-switching behavior of the semiconductor device to be formed. The stepped doping levels and the thicknesses of the flat top regions as well as the number of flat top regions can be selected to tune the electric field shape or electric field distribution for improved ruggedness in the semiconductor device thus formed. Furthermore, the layer thickness of the N-base region 45 can be tuned to obtain the desired depth of the field stop zone from the wafer surface. Accordingly, by using the epitaxial process, a field stop zone with a multiple stepped flat doping profile can be formed at a desired depth from the wafer surface.

In one embodiment, the epitaxial process forms the multiple stepped flat doping profile as the field stop zone in the epitaxial layer 43 by setting the epitaxy growth doping gas flow to the background doping level and then applying and holding the doping gas flow for the flat top regions. More specifically, the epitaxial process begins the epitaxy growth by setting the doping gas flow to the background doping concentration. The epitaxy growth rate is fixed. As the epitaxy growth progresses, the doping gas flow is increased to form the stepped flat top region and the increased doping gas flow is held for the target flat top region thickness. After the desired flat top region is formed, the doping gas flow returns to the background doping concentration set point and the epitaxy process continues until the next flat top region is to be formed. After the field stop zone is formed, the epitaxial process continues at a constant N-type doping concentration set point to form the base region epitaxial layer. The constant N-type doping concentration set point for the base region can be the same as or less than the field stop zone background doping concentration.

(3) Multiple Spike Doping Field Stop Zone

Figure 7:
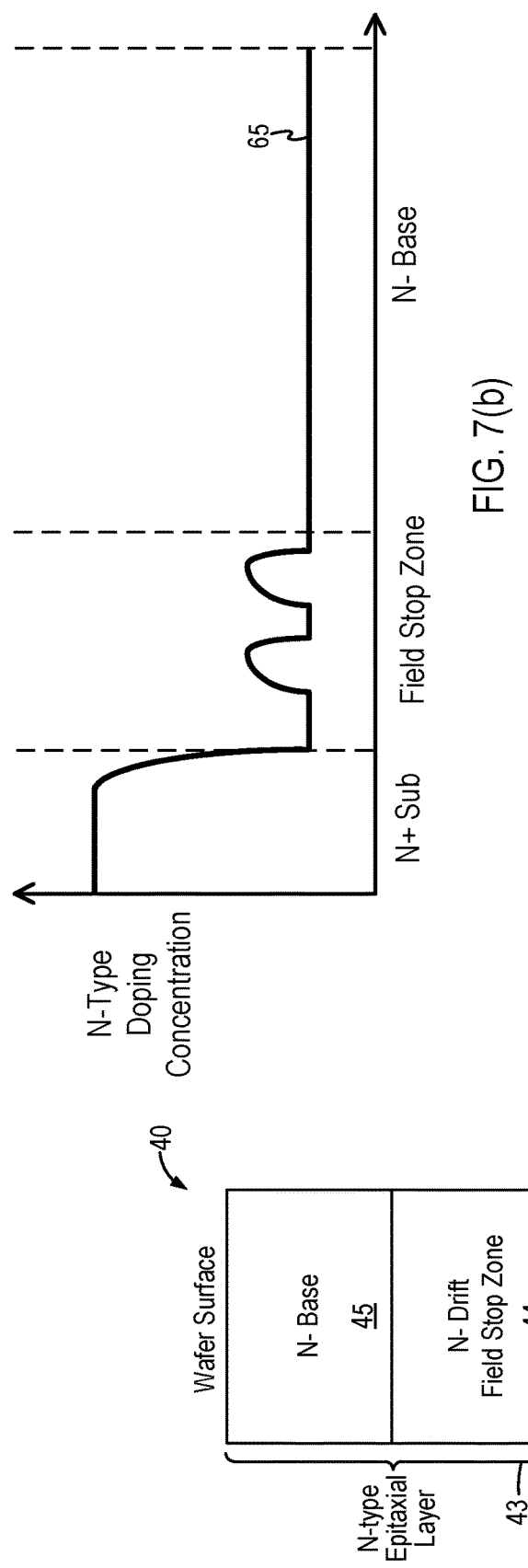
FIG. 7, which includes
Figure 7:
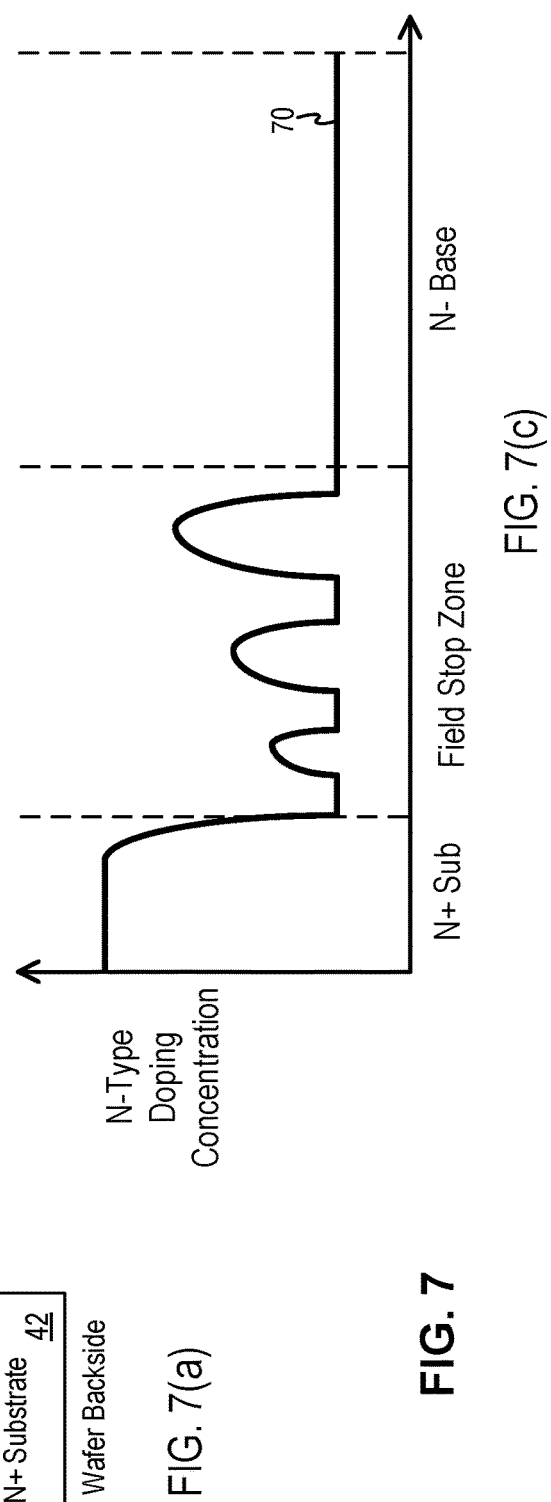

FIG. 7, which includes FIGS. 7(a)-7(c), illustrates a semiconductor body incorporating an epitaxial layer field stop zone and a spike doping profile which can be formed in the field stop zone in embodiments of the present invention. FIG. 7(a) duplicates FIG. 4(a) and illustrates the semiconductor body 40 including the N+ substrate 42 and an N-type epitaxial layer 43 formed thereon. FIGS. 7(b) and 7(c) illustrate examples of the spike doping profiles 65, 70 which can be formed in the epitaxial layer field stop zone in the present embodiment. The doping profiles shown in FIGS. 7(b) and 7c) illustrate the N-type doping concentration from the N+ substrate 42 to the N-base 45 from left to right.

In the embodiment shown in FIG. 7(b), the substrate 42 is a heavily doped N-type substrate and thus the substrate 42 has a high N-type doping concentration. The epitaxial process grows the epitaxial layer 43 on the substrate 42. The field stop zone 43 has a multiple spike doping profile 65. That is, the field stop zone has a background doping level and multiple spike doping regions with spike increase in doping levels. The spike doping regions are spaced apart in the field stop zone. The N-Base region 45 is then formed with the epitaxial layer having a constant doping level. The N-Base region 45 is typically lightly doped and thus the N-Base region 45 has a low N-type doping level. The background doping level of the field stop zone 44 can be the same as or higher than the doping level of the N-Base region 45.

In the example shown in FIG. 7(b), the field stop zone includes two spike doping regions having substantially the same width or same epitaxial layer thickness and with the same doping level. In other embodiments, the number of spike doping regions within the field stop zone, the width or thickness of the spike doping regions, the spacing of the spike doping regions and the doping level of the spike doping regions can be tuned to obtain the desired doping profile for the field stop zone. In particular, the doping levels or the thickness of the spike doping region can be selected based on the application voltage of the semiconductor device to be formed. For example, in other embodiments, the spike doping regions can all have the same doping levels. In another example, the spike doping regions can have different width or epitaxial layer thicknesses while having the same or different doping levels. The doping levels can increase towards the N-base region or decrease towards the N-base region. In one example, the spike doping region closes to the N-base region can have a higher doping level or an increased thickness as compared to the spike doping regions closer to the substrate to stop the spread of the depletion layer under certain application voltage levels so as to reduce current ringing.

FIG. 7(c) illustrates an alternate embodiment of the spike doping profile 70 where the field stop zone includes three spike doping regions with increasing doping levels from the first spike doping region near the substrate to the last spike doping region near the N-Base region. Furthermore, the spike doping regions of FIG. 7(c) has increasing thickness, illustrated as increasing width in the doping profile in FIG. 7(c), from the first spike doping region near the substrate to the last spike doping region near the N-base region.

The multiple spike doping profiles described herein can be applied in a field stop zone to improve the soft-switching behavior of the semiconductor device to be formed. The doping levels and the thicknesses of the spike doping regions as well as the number of spike doping regions can be selected to tune the electric field shape or electric field distribution for improved ruggedness in the semiconductor device thus formed. Furthermore, the layer thickness of the N-base region 45 can be tuned to obtain the desired depth of the field stop zone from the wafer surface. Accordingly, by using the epitaxial process, a field stop zone with a multiple spike doping profile can be formed at a desired depth from the wafer surface.

In one embodiment, the epitaxial process forms the multiple spike doping profile as the field stop zone in the epitaxial layer 43 by setting the epitaxy growth doping gas flow to the background doping level and then changing the doping gas flow rapidly to form the spike doping regions. More specifically, the epitaxial process begins the epitaxy growth by setting the doping gas flow to the background doping concentration. The epitaxy growth rate can be adjustable or non-constant. As the epitaxy growth progresses, the doping gas flow is increased rapidly and turned off rapidly to form the spike doping region. After the desired spike doping region is formed, the doping gas flow returns to the background doping concentration set point and the epitaxy process continues until the next spike doping region is to be formed. After the field stop zone is formed, the epitaxial process continues at a constant N-type doping concentration set point to form the base region epitaxial layer. The constant N-type doping concentration set point for the base region can be the same as or less than the field stop zone background doping concentration.

It is instructive to note that while the conventional backside implantation method to form the field stop zone can form one or more peaks in the doping profiles, the conventional backside implantation method is not capable of giving fine control over the location, the thickness or width and the peak doping level of the spike doping regions. When high energy implantation method is used, only coarse control over the doping profile can be realized. Furthermore, high energy implantation method cannot form a flat top doping region. The epitaxial layer field stop zone of the present invention can be formed with precise control over the location, the thickness and the peak doping levels of the field stop zone doping profile, ensuring improved soft switching behavior.

With the semiconductor body of FIGS. 5-7 thus formed including the epitaxial layer field stop zone with enhanced doping profile, front side processing is then carried out to form the device region of the semiconductor device to be formed. The device region, such as the pn junction of the semiconductor device, is formed on the top or front side of the semiconductor body. For example, a PN junction diode can be formed in the semiconductor body by forming a P-body and a P+ region on the front side of the semiconductor body, as shown in FIG. 3(a). In another example, a semiconductor body using a P-type substrate may be used to form an IGBT device. The semiconductor body is subjected to front side processing including forming the P-body region, the N+ source region, the gate dielectric layer and the conductive gate, as shown in FIG. 3(b). A trench gate IGBT can also be formed, such as shown in FIG. 3(c).

RC-IGBT (Reverse Conducting IGBT)

In embodiments of the present invention, an RC-IGBT includes a semiconductor body formed having a base region incorporating a field stop zone where the base region and the field stop zone are both formed using an epitaxial process, as described above with reference to FIGS. 4-7. The epitaxial layer field stop zone is formed with an enhanced doping profile to realize improved soft-switching performance for the semiconductor device. In some embodiments, the enhanced doping profile formed in the field stop zone includes varying, non-constant doping levels. In some embodiments, the enhanced doping profile formed in the field stop zone includes one of an extended graded doping profile, a multiple stepped flat doping profile, or a multiple spike doping profile, as described above with reference to FIGS. 5-7.

An RC-IGBT or reverse conducting IGBT is an IGBT device with a backside N+ region to enable current to be conducted from the backside of the RC-IGBT device. In an IGBT, such as IGBT 20 of FIG. 3(*b*), includes a PNP bipolar transistor formed by the P-type substrate 22, the N-drift/N-base region 24, and the P-body region 26 and a MOS transistor formed by the N+ source region 27, the gate 29 and the N-drift region as the drain. The IGBT 20 cannot conduct current from the backside—that is, current cannot go through the P-body to the N-base/N-drift region to the P-substrate.

Figure 8:
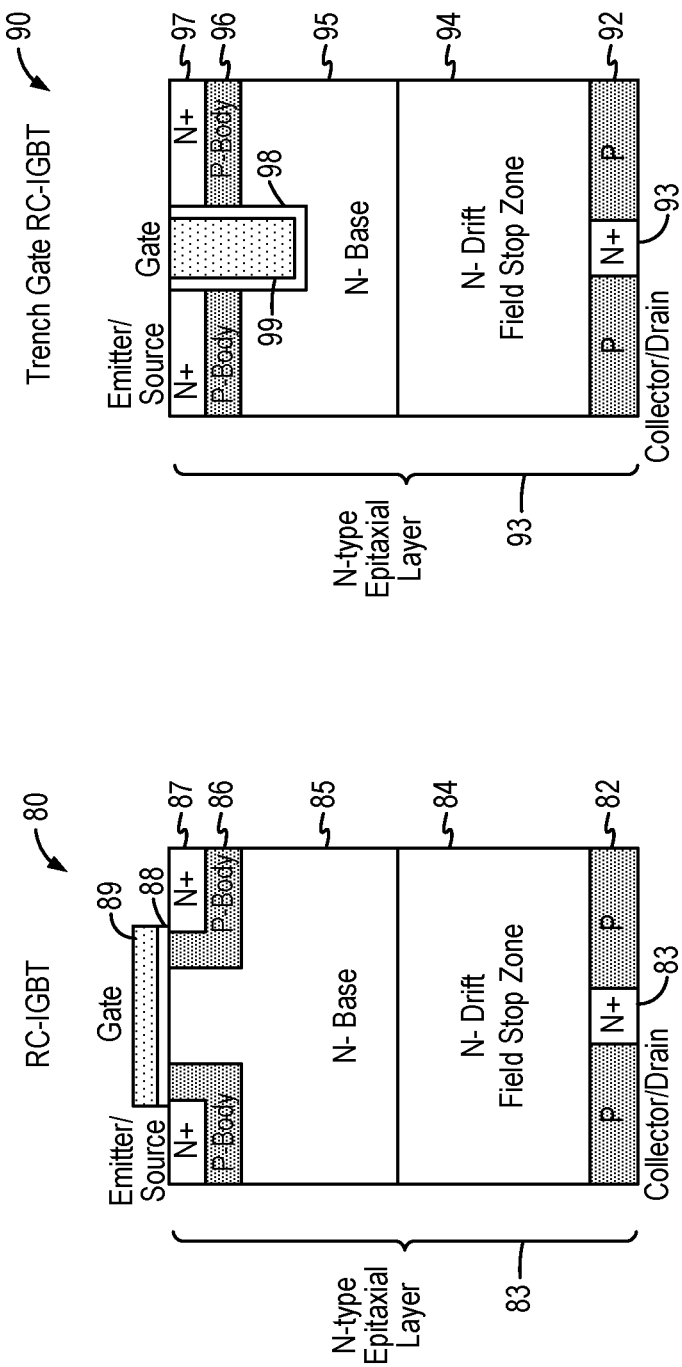
FIG. 8, which includes

An RC-IGBT device integrates an IGBT and a freewheeling diode in the same device structure and thereby enables backside current conduction. FIG. 8, which includes FIGS. 8(*a*) and 8(*b*), are cross-sectional views of RC-IGBT semiconductor devices that can be constructed using the epitaxial layer field stop zone in embodiments of the present invention. Referring to FIG. 8(*a*), an RC-IGBT 80 is constructed in the same manner as the IGBT 20 of FIG. 3(*b*) except for the addition of the N+ region 83 on the backside, the collector terminal, of the device, as the backside contact region. As thus configured, a diode is formed by the P-body region 86 and the N+ region 83 and backside current conduction is made possible. Referring to FIG. 8(*b*), a trench gate RC-IGBT 90 is constructed in the same manner as the trench gate IGBT 90 of FIG. 3(*c*) except for the addition of the N+ region 93 on the backside, the collector terminal, of the device, as the backside contact region. As thus configured, a diode is formed by the P-body region 96 and the N+ region 93 and backside current conduction is made possible.

In embodiments of the present invention, the RC-IGBT 80 of FIG. 8(*a*) is formed in a semiconductor body including an N-type epitaxial layer 83 where the N-type epitaxial layer 83 incorporates a field stop zone 84 constructed in the same manner as described above with references to FIGS. 4 to 7. The field stop zone 84 improves the soft switching behavior of the RC-IGBT device. Similarly, in embodiments of the present invention, the trench gate RC-IGBT 90 of FIG. 8(*b*) is formed in a semiconductor body including an N-type epitaxial layer 93 where the N-type epitaxial layer 93 incorporates a field stop zone 94 constructed in the same manner as described above with references to FIGS. 4 to 7. The field stop zone 94 improves the soft switching behavior of the trench gate RC-IGBT device.

RC-IGBT devices require both N+ and P contact regions at the backside of the device structure. Forming doped regions on both the front side and the back side of a wafer, especially for thin wafers, can be challenging. In embodiments of the present invention, RC-IGBT devices, with surface gate or trench gate, are realized through a fabrication process that uses front side processing only to form the backside contact regions and the front side device region and incorporate an epitaxial layer field stop zone with enhanced doping profile. The fabrication process enables RC-IGBT devices to be formed with the backside contact regions and the epitaxial layer field stop zone even for thin wafer thicknesses.

Conventional methods for forming RC-IGBT devices including performing the front side processing to form the device region (gate dielectric, gate polysilicon, body region, source region, contact and metallization) on the front side of the wafer. The wafer is then flipped over and background to the desired thickness. Then backside processing is carried out to form the N+ and P contact regions. The field stop zone may be formed by backside implantation as well. Laser anneal or a low temperature anneal is then performed to activate the implanted dopants of the field stop zone and the N+ and P regions. The conventional back grind and backside implantation methods for forming RC-IGBT devices are undesirable for the reasons described above, including the requirement for backside processing, the inability to control the profile of the field stop zone and the limitation of the anneal temperature that can be used. In particular, the conventional method requires performing backside lithographic process on thin wafers which requires special lithographic equipment to pattern the wafer backside for the N+ and P regions, special thin film equipment to strip the photoresist on thin wafers, and modification to the implant equipment to perform implantation on thin wafers. Also, the conventional method also requires special laser anneal equipment that can handle thin wafers to perform annealing of the implanted N+ and P regions.

Figure 9:
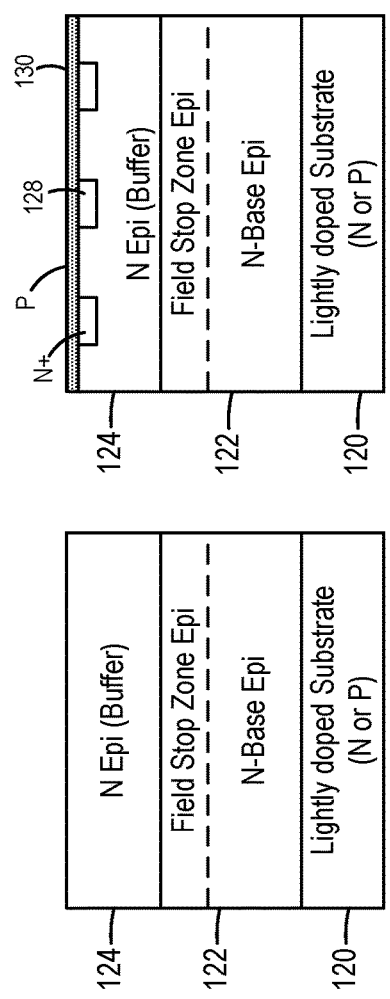
FIG. 9, which includes
Figure 9:
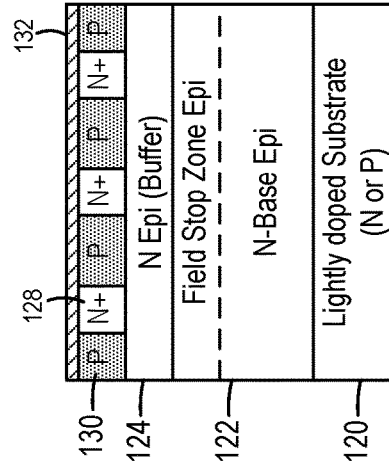
Figure 9:
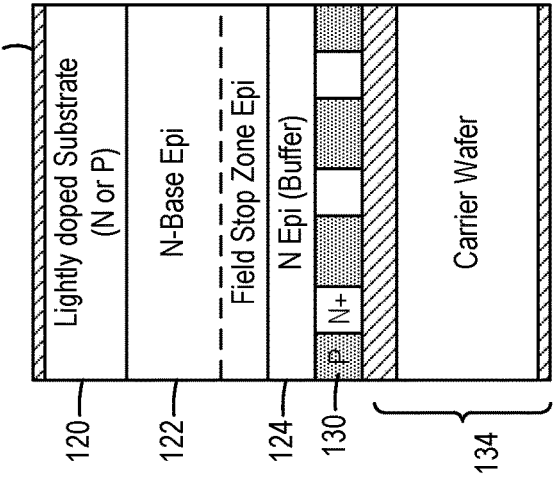
Figure 9:
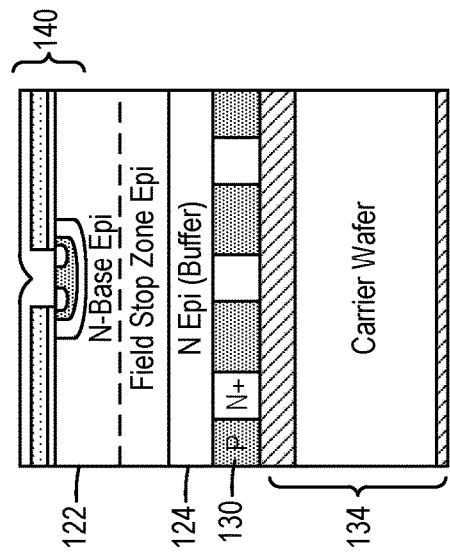
Figure 9:
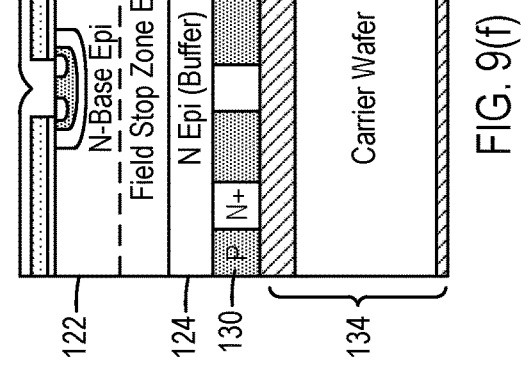
Figure 9:
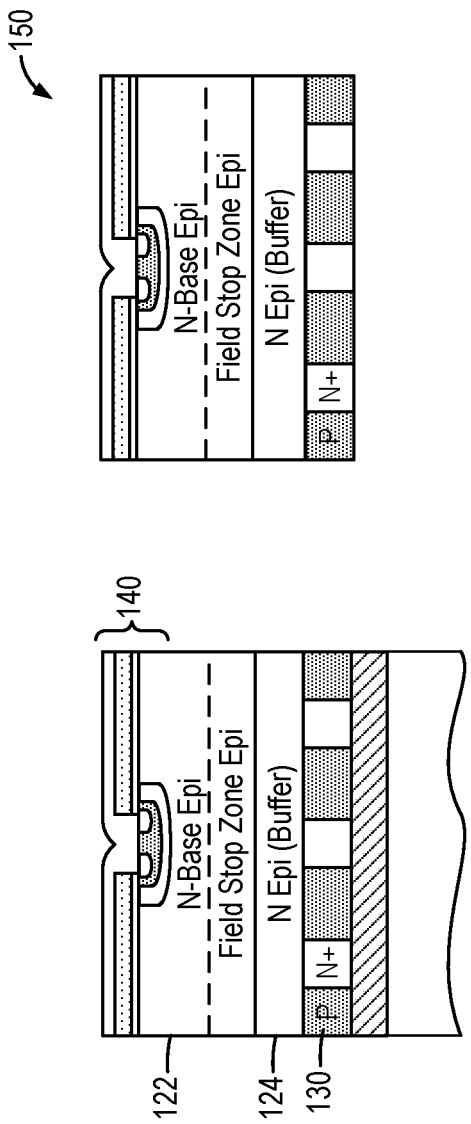

In embodiments of the present invention, a semiconductor device fabrication method for forming an RC-IGBT incorporating an epitaxial layer field stop zone uses only front side processing to form the backside N+ and P contact regions. FIG. 9, which includes FIGS. 9(*a*) to 9(*h*), illustrates the semiconductor device fabrication method for forming an RC-IGBT in embodiments of the present invention. Referring to FIG. 9(*a*), the method starts with a lightly doped wafer substrate 120 of either N-type or P-type. Then an epitaxial process is carried out to form an N-type epitaxial layer 122 on the substrate 120. The epitaxial process is carried out by first using a constant doping level to form a first portion of the epitaxial layer which would become the N-base region. The epitaxial process then continues with changing doping levels to form the second portion of the epitaxial layer which would become the field stop zone. The doping levels of the epitaxial process can be changed in the manner as described above with reference to FIGS. 5-7 to form the desired field stop zone doping profile. For example, the second portion of the epitaxial layer can be formed to have an extended graded doping profile, a multiple stepped flat doping profile, or a multiple spike doping profile, suitable for the application of the RC-IGBT.

It is instructive to note that the epitaxial process for forming the N-base and the field stop zone in the method of the present embodiment is reversed in reference to the process described above in FIGS. 4-7. In the aforementioned description for forming a PN junction diode or an IGBT, the semiconductor body is formed by growing the epitaxial layer on a given substrate where the substrate would become the backside of the semiconductor device to be formed. The epitaxial growth starts with the field stop zone on the substrate and then continues onto the N-base region. In the method of the present invention for forming the RC-IGBT, the lightly doped substrate 120 is a sacrificial substrate to enable the formation of the RC-IGBT backside N+ and P contact regions using only front side processing. Therefore, the present method forms the semiconductor body in a reverse order—by forming the N-base region first and then forming the field stop zone. One of ordinary skill in the art would appreciate that the doping profiles in FIGS. 5-7 can be applied for an epitaxial process which grows the epitaxial layer from the N-base to the field stop zone. In this case, the doping profile desired for the field stop zone can be achieved by adjusting the epitaxy doping concentration of the field stop zone as the epitaxial process continues from the end of the N-base region into the field stop zone in a manner to achieve the field stop zone profiles from right to left as shown in FIG. 5-7.

Referring still to FIG. 9(a), the method grows an N-type epitaxial layer 124 as a buffer layer. In some embodiments, the buffer layer has a doping level that is lower than the doping level of the N-base Epitaxial layer 122 but higher than the doping level of the lightly doped N-type wafer substrate. Referring now to FIG. 9(b), the backside N+ and P regions of the RC-IGBT are formed in the buffer layer 124 by masking and selectively implanting N-type and P-type dopants. The implanted dopants will be activated and will diffuse into the buffer layer 124 at a later anneal process. In the present embodiment, the backside N+ contact regions 128 are formed by masking the buffer layer 124 to expose regions 128 for receiving a high dose N+ implant. Then, a blanket P-type implant is performed to form the P contact regions 130 outside of the N+ contact region 128. After the implantation, the drive-in or anneal process for the N+ implant and P-type implant can be performed later in the fabrication process, such as together with the implant regions in the device regions to be formed on the opposite side of the semiconductor structure.

FIG. 9(c) illustrates the backside N+ regions 128 and P regions 130 formed after a subsequent anneal process. The actual anneal of the implanted dopants may occur during a later time in the processing. The formation of the N+ regions 128 and P regions 130 in FIG. 9(c) is illustrative only. After the implantation step for the N+ regions and P regions in the buffer layer 124, the wafer is subjected a thermal oxidation process which forms a thermal oxide layer 132 on the exposed surface of the wafer. Thus, the thermal oxide layer 132 is formed on the buffer layer 124 as well as on the lightly doped substrate 120. The thermal oxide layer 132 will be used as a bonding layer in subsequent processing. Up to this point, the method has only employed front side processing of the semiconductor structure formed on the substrate 120.

Referring to FIG. 9(d), the semiconductor structure as formed in FIG. 9(c) is flipped upside down and is attached to a carrier wafer 134. The thermal oxide layer 132 grown on the buffer layer 124 helps the adhesion of the semiconductor structure to the carrier wafer. With the semiconductor structure flipped, the N-type epitaxial layer 122 now has the second portion forming the field stop zone on the bottom with the first portion forming the N-base region on top. The side of the semiconductor structure with the lightly doped substrate 120 becomes the front side of the wafer. It is instructive to note that the use of the terms "top" and "bottom" and "front" and "back" are intended to denote relative directions or positions of the layers in the semiconductor structure and is not intended to indicate absolute direction or positioning of the semiconductor structure.

Referring to FIG. 9(e), the front side of the wafer is subjected to grinding and polishing to remove the sacrificial substrate 120 and to thin the N-type epitaxial layer 122 down to the desired N-base thickness. Although the N-type epitaxial layer 122 is thinned, the carrier wafer 134 provides thickness to the semiconductor structure so that no special thin wafer processing step or equipment is required.

Referring to FIG. 9(f), front side processing is then carried out to form the device region 140 of the RC-IGBT semiconductor device. For example, the body region, the emitter/source region, the gate dielectric layer, the conductive gate layer, the interlayer dielectric, the contact and the metallization layer are formed using front side processing. Referring to FIG. 9(g), after forming the device region 140, the RC-IGBT device is completed. The semiconductor structure is then subjected to back grinding and wet etch to remove the carrier wafer 134 to expose the backside contact regions previously formed. The thermal oxide layer 132 between the backside contact layer and the carrier wafer acts as an etch stop for the wet etch process to remove the carrier wafer. The thermal oxide layer 132 is then also removed, such as by wet etch, to expose the backside contact regions.

Referring to FIG. 9(h), the back grinding removes the carrier wafer and stops at the thermal oxide layer. Then, the thermal oxide layer is etched, such as using wet etch, to expose the N+ contact regions 128 and P contact regions 130 formed on the backside of the device. The epitaxial layer field stop zone with an enhanced doping profile is formed above the buffer layer 124 and below the N-base region. It is instructive to note that the entire RC-IGBT device 150 in FIG. 9(h) is formed using front side processing only and without requiring thin wafer equipment or process. That is, no backside lithography, backside implantation, or laser anneal is required. The semiconductor device fabrication method forms the RC-IGBT device 150 using front side processing to form the backside contact regions and then using wafer bonding process to flip the semiconductor structure onto a carrier wafer so that front side processing is used again to form the device region. The carrier wafer provides the thickness for the semiconductor structure so that the fabrication of the RC-IGBT device does not require special thin wafer processing equipment or process.

The semiconductor device fabrication method of the present invention realizes an RC-IGBT which incorporates an epitaxial layer field stop zone and uses only front side processing to form the backside N+ and P contact regions. The semiconductor device fabrication method of the present invention simplifies the fabrication process, reducing cost and improving efficiency of the manufacturing process while forming a semiconductor device with improved soft-switching capability.

In the above described embodiment, the buffer layer 124 is formed by the epitaxial process. In other embodiments, the buffer layer can be formed by implantation of N-type dopants into the N-type epitaxial layer 122 being formed to use as the N-base and field stop zone.

In the above described embodiment, the P-type backside contact region 130 is formed by implantation into a lightly doped N-Epitaxial buffer layer. In other embodiments, the P-type backside contact region 130 can be formed by epitaxial growth and N-type dopants are then implanted into the P-type epitaxial layer to form the N+ contact regions 128.

Furthermore, in the above described embodiment, the semiconductor device fabrication method is described for forming a surface gate RC-IGBT. In other embodiments, the semiconductor device fabrication method of the present invention can be applied to form a trench gate RC-IGBT by forming a trench on the front side of the semiconductor structure and forming the trench gate dielectric and the trench gate inside the trench. The same wafer bonding method applies to enable the trench gate RC-IGBT to be formed using front side processing only.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An insulated gate bipolar transistor (IGBT), comprising:
   a heavily doped semiconductor layer;
   an epitaxial layer of a first conductivity type formed on the semiconductor layer, the epitaxial layer including a first portion of the first conductivity type adjacent to the semiconductor layer forming a field stop zone, and the epitaxial layer further including a second portion of the first conductivity type forming a base region, the field stop zone having a first side adjacent to the semiconductor layer and a second side adjacent to the base region, the base region having a first side adjacent to the field stop zone and a second side opposite the first side, the field stop zone and the base region being formed using a same dopant of the first conductivity type and with different doping concentrations;
   a device region formed in the second side of the base region, the device region comprising a PN junction; and
   a gate dielectric layer and a conductive gate formed in or on the epitaxial layer at the second side of the base region,
   wherein the epitaxial layer is formed to have a doping profile of the first conductivity type having a first doping level as a background doping level and having multiple flat top regions with step increase in doping levels from the first doping level, the multiple flat top regions being spaced apart within the field stop zone, wherein the multiple flat top regions include a first flat top region near the first side of the field stop zone and a last flat top region near the second side of the field stop zone, and the thickness of each of the multiple flat top regions increases from the first flat top region to the last flat top region.

2. The IGBT of claim 1, wherein the multiple flat top regions have the same or different doping levels.

3. The IGBT of claim 2, wherein the multiple flat top regions have increasing doping levels from a first flat top region near the first side of the field stop zone to a last flat top region near the base region.

4. The IGBT of claim 1, wherein the background doping level is higher than or the same as the constant doping level of the base region.

5. The IGBT of claim 1, wherein the semiconductor layer comprises a semiconductor substrate of a second conductivity type, opposite the first conductivity type, the IGBT further comprising a body region of the second conductivity type being formed in the second side of the base region, a source region of the first conductivity type being formed in the body region, and the conductive gate being formed on the epitaxial layer at the second side of the base region.

6. The IGBT of claim 1, wherein the semiconductor layer comprises a semiconductor substrate of a second conductivity type, opposite the first conductivity type, the IGBT further comprising a body region of the second conductivity type being formed in the second side of the base region, a source region of the first conductivity type being formed in the body region and the conductive gate being formed in a trench formed in the epitaxial layer at the second side of the base region.

7. The IGBT of claim 1, wherein the IGBT comprises a reverse conducting insulated gate bipolar transistor (RC-IGBT) and the semiconductor layer comprises one or more doped regions of the first conductivity type and being heavily doped, and one or more doped regions of a second conductivity type, opposite the first conductivity type, the IGBT further comprising a body region of the second conductivity type being formed in the second side of the base region, a source region of the first conductivity type being formed in the body region, and the conductive gate being formed on the epitaxial layer at the second side of the base region.

8. The IGBT of claim 1, wherein the IGBT comprises a trench gate reverse conducting insulated gate bipolar transistor (RC-IGBT) and the semiconductor layer comprises one or more doped regions of the first conductivity type and being heavily doped, and one or more doped regions of a second conductivity type, opposite the first conductivity type, the IGBT further comprising a body region of the second conductivity type being formed in the second side of the base region, a source region of the first conductivity type being formed in the body region, and the conductive gate being formed in a trench formed in the epitaxial layer at the second side of the base region.

9. The IGBT of claim 1, wherein the first conductivity type comprises NI-type conductivity and a second conductivity type comprises P-type conductivity.

10. An insulated gate bipolar transistor (IGBT) comprising:
    a heavily doped semiconductor layer;
    an epitaxial layer of a first conductivity type formed on the semiconductor layer, the epitaxial layer including a first portion of the first conductivity type adjacent to the semiconductor layer forming a field stop zone, and the epitaxial layer further including a second portion of the first conductivity type forming base region, the field stop zone having a first side adjacent to the semiconductor layer and a second side adjacent to the base region, the base region having a first side adjacent to the field stop zone and a second side opposite the first side, the field stop zone and the base region being formed using a same dopant of the first conductivity type and with different doping concentrations;
    a device region formed in the second side of the base region, the device region comprising a PN junction; and
    a gate dielectric layer and a conductive gate formed in or on the epitaxial layer at the second side of the base region,
    wherein the epitaxial layer is formed to have a doping profile of the first conductivity type having a first doping level as a background doping level and having multiple flat top regions with step increase in doping levels from the first doping level, the multiple flat top regions being spaced apart within the field stop zone, the multiple, flat top regions have increasing, doping levels from a first doped region near the first side of the field stop zone to a last doped region near the base region,
    wherein the multiple flat top regions includes a first flat top region near the first side of the field stop zone and a last flat top region near the second side of the field stop zone and the thickness of each of the multiple flat top regions increases from the first flat top region to the last flat top region.

* * * * *